(12) United States Patent
Song

(10) Patent No.: US 12,408,529 B2
(45) Date of Patent: Sep. 2, 2025

(54) OLED DISPLAY PANEL AND DISPLAY DEVICE

(71) Applicant: Wuhan China Star Optoelectronics Semiconductor Display Technology Co., Ltd., Wuhan (CN)

(72) Inventor: Changjian Song, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 59 days.

(21) Appl. No.: 17/312,158

(22) PCT Filed: Apr. 15, 2021

(86) PCT No.: PCT/CN2021/087567
§ 371 (c)(1),
(2) Date: Oct. 6, 2022

(87) PCT Pub. No.: WO2022/205515
PCT Pub. Date: Oct. 6, 2022

(65) Prior Publication Data
US 2024/0032368 A1     Jan. 25, 2024

(30) Foreign Application Priority Data
Mar. 31, 2021   (CN) .......................... 202110345292.2

(51) Int. Cl.
*H10K 59/35*     (2023.01)
*H10K 59/38*     (2023.01)
(Continued)

(52) U.S. Cl.
CPC ............ *H10K 59/35* (2023.02); *H10K 59/38* (2023.02); *H10K 59/70* (2023.02); *H10K 59/877* (2023.02);
(Continued)

(58) Field of Classification Search
None
See application file for complete search history.

(56) References Cited

U.S. PATENT DOCUMENTS 11,362,297 B2 *  6/2022  Ju ........................ H10K 59/877
11,398,529 B2 *  7/2022  Han ...................... H10K 71/00
(Continued)

FOREIGN PATENT DOCUMENTS

CN       101237731 A    8/2008
CN       103242298 A    8/2013
(Continued)

OTHER PUBLICATIONS

English translation of CN108922906A (Year: 2018).*
(Continued)

*Primary Examiner* — Dale E Page
*Assistant Examiner* — Rohit Parthasarathy
(74) *Attorney, Agent, or Firm* — Nathan & Associates Patent Agents Ltd.; Menachem Nathan

(57) ABSTRACT

The present invention provides an organic light-emitting diode (OLED) display panel and a display device. The OLED display panel includes a light-emitting device layer and a color conversion layer arranged in sequence. The light-emitting device layer includes a third light-emitting device disposed in a region of a green subpixel. The color conversion layer includes a green conversion layer disposed in the region of the green subpixel. The green conversion layer is configured to convert light emitted by the third light-emitting device into green light to relieve a problem of a short display lifespan of current OLED display panels.

14 Claims, 3 Drawing Sheets

(51) Int. Cl.
*H10K 59/70* (2023.01)
*H10K 59/80* (2023.01)
*H10K 101/00* (2023.01)
*H10K 102/00* (2023.01)

(52) U.S. Cl.
CPC ..... *H10K 59/8792* (2023.02); *H10K 2101/90* (2023.02); *H10K 2102/351* (2023.02)

(56) References Cited

U.S. PATENT DOCUMENTS

| | | | |
|---|---|---|---|
| 11,910,632 B2* | 2/2024 | Liu | H10K 50/19 |
| 12,150,327 B2* | 11/2024 | Li | H10K 71/00 |
| 12,187,935 B1* | 1/2025 | Ganapathiappan | C09K 11/06 |
| 12,193,265 B2* | 1/2025 | Wan | H10K 59/38 |
| 2020/0343319 A1* | 10/2020 | Matsueda | H10K 59/131 |
| 2022/0045138 A1* | 2/2022 | Han | H10K 59/122 |
| 2022/0190039 A1* | 6/2022 | Sun | H10K 71/00 |
| 2022/0302404 A1* | 9/2022 | Qiu | H10K 50/13 |
| 2022/0328578 A1* | 10/2022 | Li | H10K 71/00 |
| 2024/0188367 A1* | 6/2024 | Liu | H10K 59/122 |
| 2024/0298509 A1* | 9/2024 | Gong | H10K 50/865 |
| 2025/0017089 A1* | 1/2025 | Hsieh | H10K 59/353 |

FOREIGN PATENT DOCUMENTS

| | | | | |
|---|---|---|---|---|
| CN | 104183717 A | | 12/2014 | |
| CN | 107958923 A | | 4/2018 | |
| CN | 108922906 A | * | 11/2018 | ........... H01L 27/322 |
| CN | 110635061 A | * | 12/2019 | |
| CN | 111403446 A | * | 7/2020 | ........... H01L 27/322 |
| CN | 111430570 A | * | 7/2020 | ......... H01L 27/3213 |
| CN | 111554821 A | | 8/2020 | |
| CN | 111613653 A | | 9/2020 | |
| CN | 111682125 A | * | 9/2020 | ......... H01L 51/5004 |
| CN | 111755614 A | * | 10/2020 | ......... H01L 51/5004 |
| CN | 111864088 A | | 10/2020 | |
| CN | 112164709 A | * | 1/2021 | ............ H10K 59/12 |
| CN | 112310177 A | | 2/2021 | |
| JP | 2007323966 A | | 12/2007 | |
| KR | 2021-0081946 A | * | 7/2021 | ............ H10K 50/80 |

OTHER PUBLICATIONS

English translation of CN110635061A (Year: 2019).*
English translation of CN111403446A (Year: 2020).*
English translation of CN111430570A (Year: 2020).*
English translation of CN111682125A (Year: 2020).*
English translation of CN111755614A (Year: 2020).*
English translation of CN112164709A (Year: 2021).*
English translation of KR20210081946A (Year: 2021).*

* cited by examiner

OLED DISPLAY PANEL AND DISPLAY DEVICE

FIELD OF INVENTION

The present invention is related to the field of display technology and specifically to an organic light-emitting diode (OLED) display panel and a display device.

BACKGROUND OF INVENTION

Organic light-emitting diode (OLED) displays are current-type organic light-emitting devices that emit light through injection and recombination of carriers. Because the OLED displays have advantages of lightness and thinness, high brightness, low power consumption, fast response, high luminous efficiency, and good flexibility, they can meet new requirements of consumers for display configurations. More and more panel manufacturers around the world have invested a lot of research and development on this, which has greatly promoted industrialization of the OLED displays.

Currently, the OLED displays include pixelated red OLED devices, blue OLED devices, and green OLED devices to achieve a color display. Among current three-primary colors of red, green, and blue organic light-emitting materials, although the green light-emitting materials have a high luminous efficiency, they have a shortest lifespan among the current three-primary color organic light-emitting materials. Although researchers have invested a lot of energy to develop a new generation of long-lifespan green light materials, degrees of lifespan extension are still very limited. As a result, productions of long-lifespan and high-efficiency OLED displays still face huge challenges and further severely restrict applications of the OLED displays in special display fields with stricter lifespan requirements, such as automotive displays and military displays.

SUMMARY OF INVENTION

In view of disadvantages of prior art, a main purpose of the present invention is to provide an organic light-emitting diode (OLED) display panel and a display device, which can relieve the problem of a short display lifespan of the OLED display panel and the display device.

In a first aspect, the present invention provides an OLED display panel. the OLED display panel includes a plurality of pixel units. The pixel units include a red subpixel, a green subpixel, and a blue subpixel. The OLED display panel further includes:
  a substrate;
  an array driving layer disposed on the substrate;
  a light-emitting device layer disposed on the array driving layer and including a first light-emitting device emitting blue light disposed in a region of the blue subpixel, a second light-emitting device emitting red light disposed in a region of the red subpixel, and a third light-emitting device disposed in a region of the green subpixel; and
  a color conversion layer disposed on the light-emitting device layer, corresponding to the region of the green subpixel, and configured to convert light emitted by the third light-emitting device into green light.

According to the present invention, the third light-emitting device includes a light-emitting diode (LED) device.

According to the present invention, the third light-emitting device includes a blue OLED device or a white OLED device.

According to the present invention, the blue OLED device includes an anode layer, a hole injection layer, a hole transport layer, a blue light-emitting layer, an electron transport layer, an electron injection layer, and a cathode layer sequentially stacked.

According to the present invention, the blue light-emitting layer includes at least two blue light-emitting sublayers, and two adjacent blue light-emitting sublayers include different host light-emitting materials.

According to the present invention, the blue light-emitting layer includes at least two kinds of blue host light-emitting materials.

According to the present invention, the color conversion layer includes a green fluorescent material or a green quantum dot material.

According to the present invention, the OLED display panel further includes a first black matrix layer. The first black matrix layer is disposed in a gap region between the red subpixel, the green subpixel, and the blue subpixel, and is arranged in a same layer as the color conversion layer.

According to the present invention, gaps of the first black matrix layer include a first blue color resist corresponding to the region of the blue subpixel and a first red color resist corresponding to the region of the red subpixel.

According to the present invention, a transparent leveling layer corresponding to the region of the blue subpixel and the region of the red subpixel is disposed in the gaps of the first black matrix layer. A second color resist layer is disposed on the first black matrix layer, the transparent leveling layer, and the color conversion layer. The color resist layer includes a green color resist corresponding to the region of the green subpixel, a second blue color resist corresponding to the region of the blue subpixel, and a second red color resist corresponding to the region of the red subpixel.

According to the present invention, the color conversion layer is doped with scattering particles.

In a second aspect, the present invention further provides a display device. The display device includes an OLED display panel. The OLED display panel includes a plurality of pixel units. The pixel units include a red subpixel, a green subpixel, and a blue subpixel. The OLED display panel further includes:
  a substrate;
  an array driving layer disposed on the substrate;
  a light-emitting device layer disposed on the array driving layer and including a first light-emitting device emitting blue light disposed in a region of the blue subpixel, a second light-emitting device emitting red light disposed in a region of the red subpixel, and a third light-emitting device disposed in a region of the green subpixel; and
  a color conversion layer disposed on the light-emitting device layer, corresponding to the region of the green subpixel, and configured to convert light emitted by the third light-emitting device into green light.

According to the present invention, the third light-emitting device includes a blue OLED device or a white OLED device.

According to the present invention, the blue OLED device includes an anode layer, a hole injection layer, a hole transport layer, a blue light-emitting layer, an electron transport layer, an electron injection layer, and a cathode layer sequentially stacked.

According to the present invention, the blue light-emitting layer includes at least two blue light-emitting sublayers, and two adjacent blue light-emitting sublayers include different host light-emitting materials.

According to the present invention, the blue light-emitting layer includes at least two kinds of blue host light-emitting materials.

According to the present invention, the color conversion layer includes a green fluorescent material or a green quantum dot material.

According to the present invention, the OLED display panel further includes a first black matrix layer. The first black matrix layer is disposed in a gap region between the red subpixel, the green subpixel, and the blue subpixel, and is arranged in a same layer as the color conversion layer.

According to the present invention, gaps of the first black matrix layer include a first blue color resist corresponding to the region of the blue subpixel and a first red color resist corresponding to the region of the red subpixel.

According to the present invention, a transparent leveling layer corresponding to the region of the blue subpixel and the region of the red subpixel is disposed in the gaps of the first black matrix layer. A color resist layer is disposed on the first black matrix layer, the transparent leveling layer, and the color conversion layer. The color resist layer includes a green color resist corresponding to the region of the green subpixel, a second blue color resist corresponding to the region of the blue subpixel, and a second red color resist corresponding to the region of the red subpixel.

The present invention provides the OLED display panel and the display device. The OLED display panel includes the plurality of pixel units including the red subpixel, the green subpixel, and the blue subpixel. The OLED display panel further includes the substrate; the array driving layer disposed on the substrate; the light-emitting device layer disposed on the array driving layer and including the first light-emitting device emitting blue light disposed in the region of the blue subpixel, the second light-emitting device emitting red light disposed in the region of the red subpixel, and the third light-emitting device disposed in the region of the green subpixel; and the color conversion layer disposed on the light-emitting device layer and including a green conversion layer disposed in the region of the green subpixel, which is configured to convert the light emitted by the third light-emitting device into green light. In the OLED display panel, replacing a green OLED device originally disposed in the region of the green subpixel with other OLED devices of other light colors with longer light-emitting lifespans and disposing the green conversion layer to convert other light colors into green light can effectively relieve a problem of a short display lifespan of an entire OLED display panel due to a short light-emitting lifespan of the green OLED device. In addition, the OLED display panel has a simple structure and can be produced by a conventional manufacturing process, which facilitates large-scale industrial productions.

DETAILED DESCRIPTION OF EMBODIMENTS

In order to make above purposes, features, and advantages of the present invention more obvious and understandable, the following is a detailed description of preferred embodiments of the present invention in conjunction with accompanying drawings. Furthermore, directional terms mentioned in the present invention such as "upper", "lower", "front", "rear", "left", "right", "in", "out", "side", etc., only refer to directions in the accompanying drawings. Thus, the adoption of directional terms is used to describe and understand the present invention, but not to limit the present invention.

Figure 1:
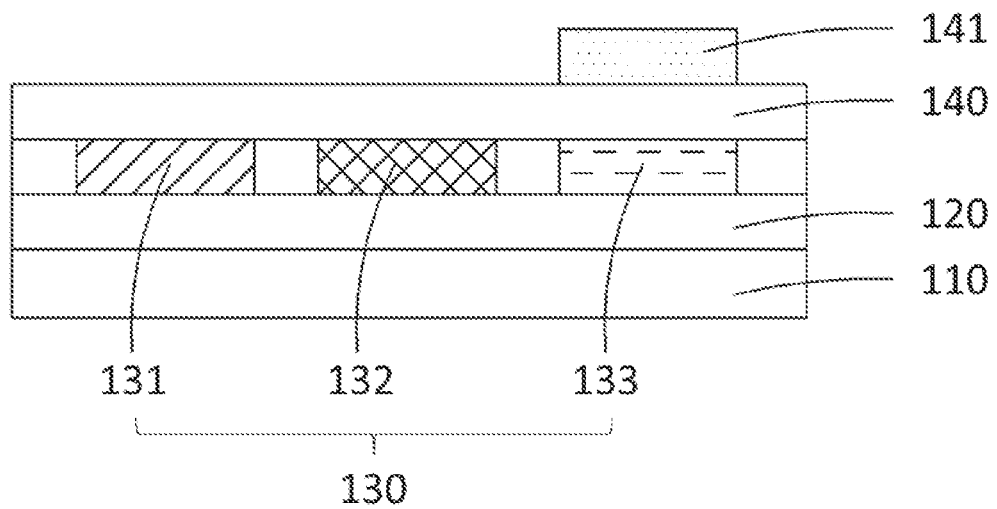
FIG. 1 is a schematic diagram of a cross-sectional structure of an organic light-emitting diode (OLED) display panel provided by an embodiment of the present invention.

An embodiment of the present invention provides an organic light-emitting diode (OLED) display panel. A detailed description is given below with reference to a schematic diagram of a cross-sectional structure of the OLED display panel shown in FIG. 1.

Specifically, the OLED display panel includes a plurality of pixel units arranged in an array and spaced apart from each other. Each of the pixel units includes a red subpixel, a green subpixel, and a blue subpixel. The OLED display panel includes:

a substrate 110, wherein according to an actual display configuration requirement, the substrate 110 can be a rigid substrate such as a glass substrate or can be a flexible substrate such as a substrate formed of a polyimide film;

an array driving layer 120 disposed on the substrate 110, wherein the array driving layer 120 is formed by stacking multiple functional layers, usually includes an active layer, a gate electrode layer, a source/drain electrode layer, an insulating layer, and other necessary film layers, is formed into a predetermined pattern through a patterning process to form a plurality of thin-film transistors arranged in an array and metal traces for signal transmission, and the thin-film transistors correspond to the pixel units and are arranged side by side in an interval area of the pixel units, which is a non-opening area;

a light-emitting device layer 130 disposed on the array driving layer 120 and including a first light-emitting device 131 emitting blue light disposed in a region of the blue subpixel and usually an OLED device emitting blue light, a second light-emitting device 132 emitting red light disposed in a region of the red subpixel and usually an OLED device emitting red light, and a third light-emitting device 133 disposed in a region of the green subpixel, wherein the first light-emitting device 131, the second light-emitting device 132, and the third light-emitting device 133 are respectively electrically connected to corresponding driving thin-film transistors in the array driving layer 120 at a lower layer;

a buffer layer 140 disposed on the light-emitting device layer 130, wherein the buffer layer 140 is usually composed of a silicon oxide film, a silicon nitride film, or a laminated film of silicon nitride and silicon oxide; and a color conversion layer 141 disposed on the region of the green subpixel on the buffer layer 140, corresponding to a top of the third light-emitting device 133, and configured to convert light emitted by the third light-emitting device 133 into green light, wherein the green subpixel finally has an ability to emit green light.

Based on current organic light-emitting materials that have been developed, green light-emitting materials have a fastest brightness decay and a shortest light-emitting lifespan, which leads to a problem of shorter lifespan of green OLED devices than OLED light-emitting devices of the other two colors. This embodiment replaces a green OLED device originally disposed in the region of the green subpixel with other OLED devices of other light colors with longer light-emitting lifespans and disposes the color conversion layer to convert other light colors into green light, so as to effectively relieve a problem of a short display lifespan of an entire OLED display panel due to a short light-emitting lifespan of the green OLED device. In addition, the OLED display panel has a simple structure and can be produced by a conventional manufacturing process, which facilitates large-scale industrial productions.

In a specific implementation of this embodiment, the third light-emitting device 133 includes a blue OLED device or a white OLED device.

Figure 2:
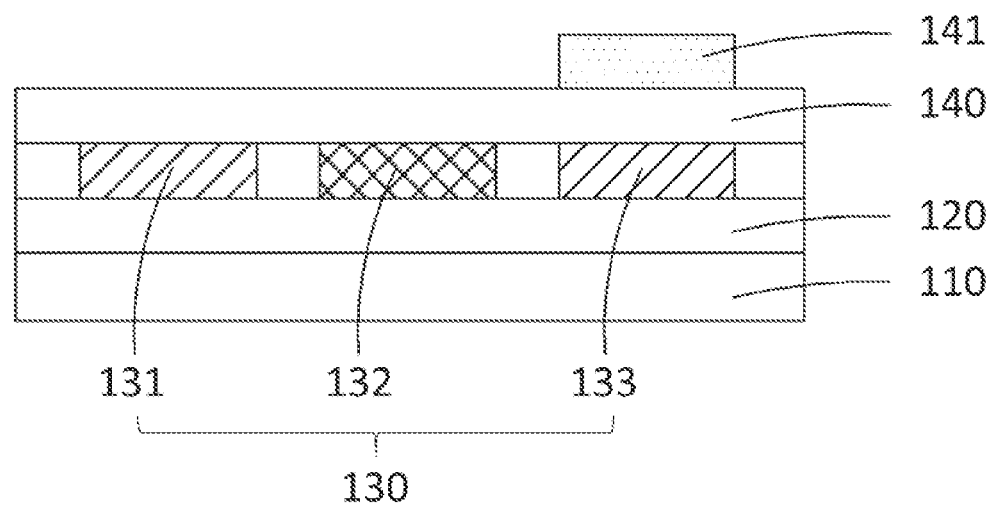
FIG. 2 is a schematic diagram of a cross-sectional structure of another OLED display panel provided by an embodiment of the present invention.

When the third light-emitting device 133 is the blue OLED device, the third light-emitting device 133 and the first light-emitting device 131 can be blue OLED devices with a same structure, which forms a structure shown in FIG. 2. In this way, the third light-emitting device 133 and the first light-emitting device 131 can be produced by a same production process to simplify production processes.

Of course, the third light-emitting device 133 is also an OLED device of other light colors, but it must satisfy that emitted light contains light with an energy greater than green light, otherwise it will not be configured as a light source basis for a green light conversion. For example, because an energy of red light is less than an energy of green light, although the red OLED device currently has a longest light-emitting lifespan among red, green, and blue OLED devices, it cannot be configured as an excitation light source for the green light conversion.

Furthermore, the third light-emitting device disposed in the region of the green subpixel may not be an OLED light-emitting device, but can also be a light-emitting diode (LED) light-emitting device based on a lifespan extension requirement.

In an embodiment, the blue OLED device disposed on the green subpixel includes an anode layer, a hole injection layer, a hole transport layer, a blue light-emitting layer, an electron transport layer, an electron injection layer, and a cathode layer sequentially stacked. A material of each functional layer of the blue OLED device can be selected from commonly used materials in the field, and the present invention does not specifically limit this. In addition, besides the above functional layers, the blue OLED device can further include other functional layers such as a hole blocking layer, an electron blocking layer, or an optical coupling output layer according to actual process requirements.

Furthermore, in order to extend a lifespan of the blue OLED device, a structure or the materials of each functional layer can be optimized. Specifically, the blue light-emitting layer can be optimized. For example, the blue light-emitting layer is designed to include at least two stacked blue light-emitting sublayers, and two adjacent blue light-emitting sublayers include different host light-emitting materials; or the blue light-emitting layer is designed to include at least two kinds of blue host light-emitting materials, which match luminescent materials of different energy levels with each other to increase a luminous efficiency and the lifespan of the blue OLED device.

It can be understood that the blue subpixel also adopts the optimized blue OLED device described above, so that lifespans of the OLED devices of the blue subpixel and the green subpixel are further extended. Therefore, a lifespan difference between the OLED devices the blue subpixel and the green subpixel and the OLED device of the red subpixel is shortened, thereby further extending a display lifespan of the OLED display panel.

In an embodiment, the color conversion layer includes a green fluorescent material, a green quantum dot material, or other materials that can achieve light-emitting color conversion through photoluminescence principle.

A quantum dot is an important low-dimensional semiconductor material, and its three dimensions are not longer than twice an exciton Bohr radius of a corresponding semiconductor material. The quantum dot is generally spherical or quasi-spherical, and its diameter usually ranges from 2 to 20 nanometers. Common quantum dots are composed of IV, II-VI, IV-VI, or III-V elements, such as silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, or indium arsenide quantum dots. The color conversion layer is produced by adopting quantum dots of a certain material and size, which can effectively convert the light emitted by the third light-emitting device into green light.

Figure 3:
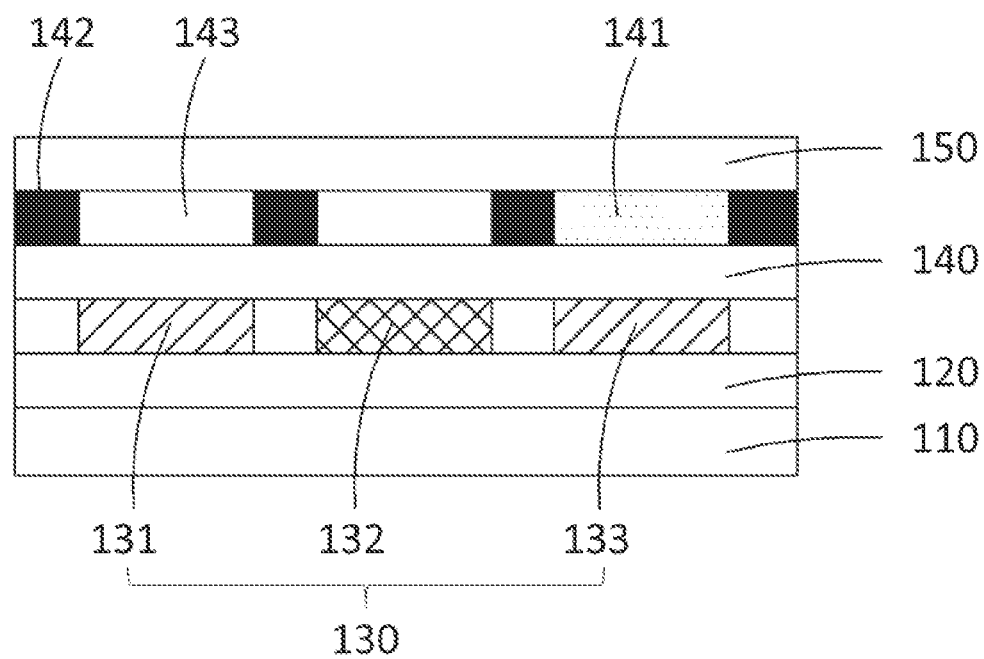
FIG. 3 is a schematic diagram of a cross-sectional structure of another OLED display panel provided by an embodiment of the present invention.

In an embodiment, referring to a schematic diagram of a cross-sectional structure shown in FIG. 3, the OLED display panel further includes a first black matrix layer 142. The first black matrix layer 142 is disposed in a gap region between the red subpixel, the green subpixel, and the blue subpixel and is disposed on a same layer as the color conversion layer 141.

Furthermore, a transparent leveling layer 143 is further disposed in a region where gaps of the first black matrix layer 142 correspond to the blue subpixel and the red subpixel. Heights of the transparent leveling layer 143 and the first black matrix layer 142 are substantially same to form a flat upper surface to achieve a planarization effect. The transparent leveling layer 143 is usually composed of a transparent organic material and basically does not absorb red light and blue light, so it will not cause brightness losses of the pixels.

A thin-film encapsulation layer 150 is disposed on the first black matrix layer 142, the color conversion layer 141, and the transparent leveling layer 143. The thin-film encapsulation layer 150 is usually formed by stacking a first inorganic film layer, an organic film layer, and a second inorganic film layer to prevent an intrusion of external water and oxygen from causing the OLED light-emitting device to fail and even causing a poor display.

Figure 4:
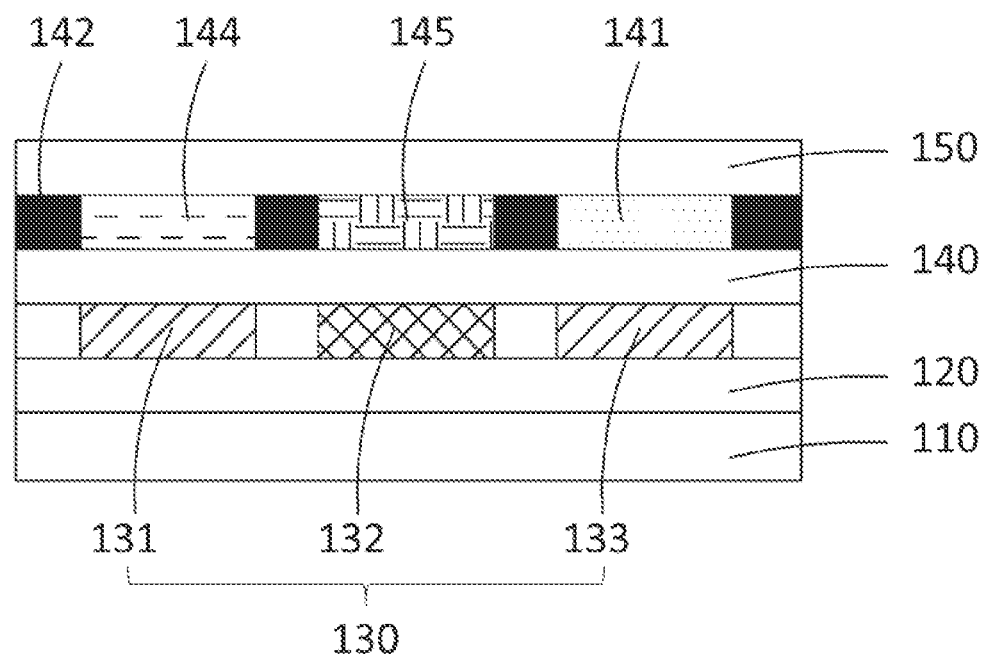
FIG. 4 is a schematic diagram of a cross-sectional structure of another OLED display panel provided by an embodiment of the present invention.

In an embodiment, the transparent leveling layer in the above embodiments can further be replaced with color resists. Specifically, referring to a schematic diagram of a cross-sectional structure shown in FIG. 4, the gaps of the first black matrix layer 142 further include a first blue color resist 144 corresponding to the region of the blue subpixel of the first light-emitting device 131, and a first red color resist 145 corresponding to the region of the red subpixel of the second light-emitting device 132. The first blue color resist 144, the first red color resist 145, the color conversion layer 141, and the first black matrix layer 142 can absorb and filter most of light that enters the OLED display panel from outside, thereby greatly reducing a reflection effect of the OLED display panel on ambient light. Therefore, a polarizer that needs to be attached onto the OLED display panel is replaced, the production processes of the OLED display panel are simplified, and a thickness of the OLED display panel is reduced, thereby achieving a better bending performance.

In the OLED display panel provided by the above embodiments, a light-color conversion rate of the color conversion layer 141 to the light emitted by the third light-emitting device 133 generally depends on a thickness of the color conversion layer 141 and a contained color conversion material.

In order to increase the light-color conversion rate of the color conversion layer 141, in a first aspect, the thickness of the color conversion layer 141 can be appropriately increased, so that a time for the light emitted by the third light-emitting device 133 to pass through the color conversion layer 141 is increased. Therefore, the light color conversion rate of the color conversion layer 141 is increased.

In a second aspect, the color conversion layer 141 can be formed by a mixture of multiple different color conversion materials. Through a cooperation of the different color conversion materials, the light-color conversion rate of the color conversion layer 141 is increased.

In a third aspect, the color conversion layer 141 can be doped with scattering particles, so that the light emitted by the third light-emitting device 133 is scattered when entering the color conversion layer 141. Light paths in the color conversion layer 141 are extended, so that the light-color conversion rate of the color conversion layer 141 is increased. Specifically, by adjusting a doping ratio and a particle size of the scattering particles, the light-color conversion rate of the color conversion layer 141 is maximally increased.

Figure 5:
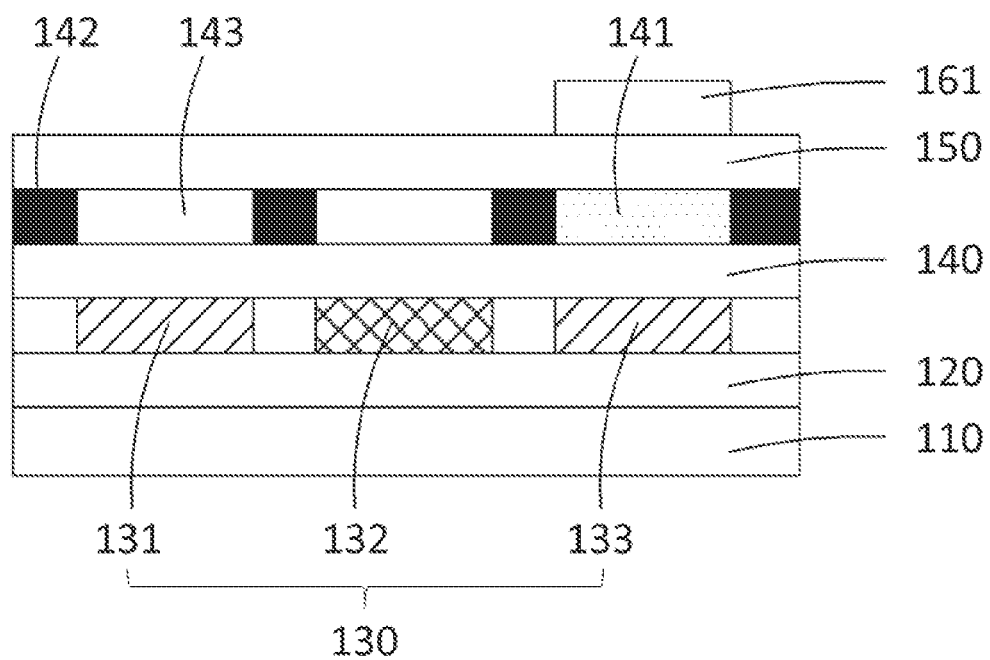
FIG. 5 is a schematic diagram of a cross-sectional structure of another OLED display panel provided by an embodiment of the present invention.

However, in actual implementations, it is difficult to increase the light-color conversion rate of the color conversion layer 141 to 100% regardless of any process. Therefore, after the light emitted by the third light-emitting device 133 passes through the color conversion layer 141, except for green light, there is inevitably part of unconverted light of other colors. A color purity of the green subpixel is thus affected, which further leads to a poor display quality of the OLED display panel. In order to solve this problem, in an embodiment, a color resist layer for filtering light is further provided. Specifically, referring to a schematic diagram of a cross-sectional structure shown in FIG. 5, a green color resist 161 is disposed on the thin-film encapsulation layer 150 corresponding to the region of the green subpixel, which corresponds to a top of the color conversion layer 141. After the light emitted by the color conversion layer 141 passes through the green color resist 161, other light except green light is absorbed and filtered out, thereby effectively increasing the color purity of the green subpixel.

Figure 6:
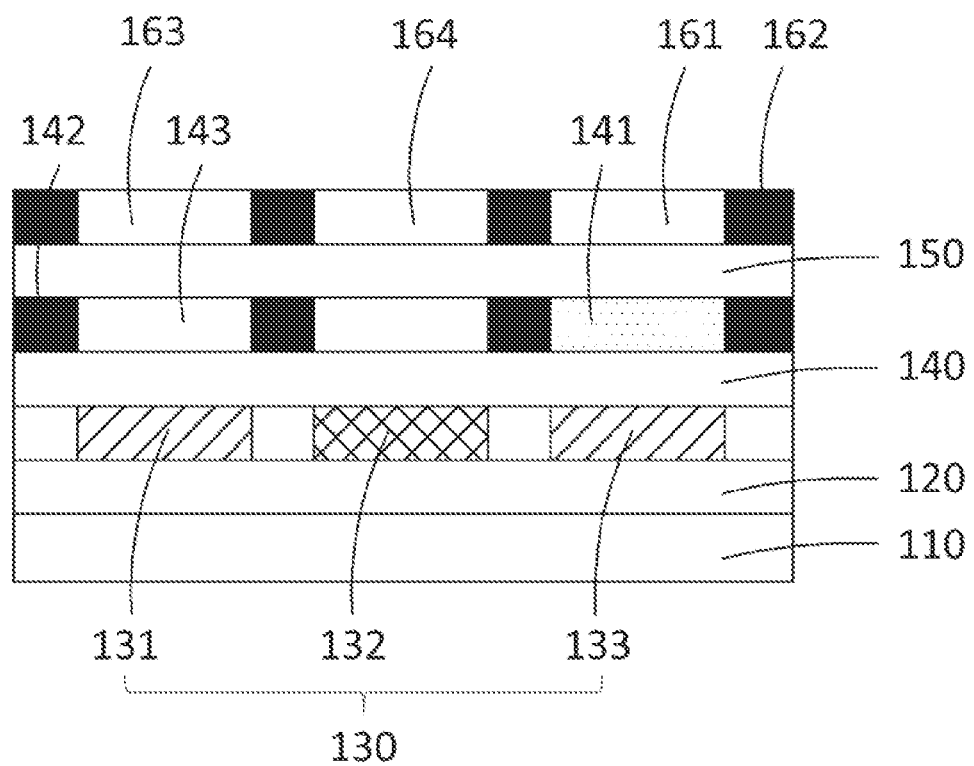
FIG. 6 is a schematic diagram of a cross-sectional structure of another OLED display panel provided by an embodiment of the present invention.

Furthermore, referring to a schematic diagram of a cross-sectional structure shown in FIG. 6, a second black matrix layer 162 is further disposed on the thin-film encapsulation layer 150 corresponding to the gap region between the red subpixel, the green subpixel, and the blue subpixel. Also, a second blue color resist 163 is disposed in the region corresponding to the blue subpixel, and a second red color resist 164 is disposed the region corresponding to the red subpixel. The blue subpixel and the red subpixel respectively directly emit light from an OLED device corresponding to their light color, and theoretically, there is no light of other colors. However, in an actual display operation, there will inevitably be some large-angle scattered light entering adjacent sub-pixels of different colors. The second blue color resist 163 and the second red color resist 164 can absorb and filter this part of the light, thereby improving a display quality of the OLED display panel.

It should be explained that only the above structure is described in the above embodiments of the OLED display panel, the OLED display panel of an embodiment of the present invention can further include any other necessary structures as required, and a specific structure is not limited herein.

Another embodiment of the present invention further provides a display device. The display device includes the OLED display panel provided in the above embodiments. The OLED display panel can be a smart phone, a tablet computer, a laptop computer, a digital camera, a digital video camera, a smart wearable device, a car display, a television, an e-book reader, etc.

The present invention has been described by the above related embodiments, but the above embodiments are merely examples for implementing the present invention. It must be noted that the disclosed embodiments do not limit the scope of the present invention. Rather, modifications and equivalent arrangements are intended to be included within the scope of the appended claims.

What is claimed is:

1. An organic light-emitting diode (OLED) display panel, comprising:
   a plurality of pixel units comprising a red subpixel, a green subpixel, and a blue subpixel;
   a substrate;
   an array driving layer disposed on the substrate;
   a light-emitting device layer disposed on the array driving layer and comprising a first light-emitting device emitting blue light disposed in a region of the blue subpixel, a second light-emitting device emitting red light disposed in a region of the red subpixel, and a third light-emitting device disposed in a region of the green subpixel;
   a color conversion layer disposed on the light-emitting device layer, corresponding to the region of the green subpixel, and configured to convert light emitted by the third light-emitting device into green light;
   a first black matrix layer, wherein the first black matrix layer is disposed in gap regions between the red subpixel, the green subpixel, and the blue subpixel, and is arranged in a same layer as the color conversion layer;
   a transparent leveling layer disposed in gaps of the first black matrix layer corresponding to the region of the blue subpixel and the region of the red subpixel, wherein the transparent leveling layer is formed to have a same height as that of the first black matrix layer for planarization; and
   a color resist layer disposed on the first black matrix layer, the transparent leveling layer, and the color conversion layer, wherein the color resist layer comprises a green color resist corresponding to the region of the green subpixel, a blue color resist corresponding to the region of the blue subpixel, and a red color resist corresponding to the region of the red subpixel.

2. The OLED display panel according to claim 1, wherein the third light-emitting device comprises a light-emitting diode (LED) device.

3. The OLED display panel according to claim 1, wherein the third light-emitting device comprises a blue OLED device or a white OLED device.

4. The OLED display panel according to claim 3, wherein the blue OLED device comprises an anode layer, a hole injection layer, a hole transport layer, a blue light-emitting layer, an electron transport layer, an electron injection layer, and a cathode layer sequentially stacked.

5. The OLED display panel according to claim 4, wherein the blue light-emitting layer comprises at least two blue light-emitting sublayers, and two adjacent blue light-emitting sublayers comprise different host light-emitting materials.

6. The OLED display panel according to claim 4, wherein the blue light-emitting layer comprises at least two kinds of blue host light-emitting materials.

7. The OLED display panel according to claim 1, wherein the color conversion layer comprises a green fluorescent material or a green quantum dot material.

8. The OLED display panel according to claim 1, wherein the color conversion layer is doped with scattering particles.

9. A display device, comprising an organic light-emitting diode (OLED) display panel;
wherein the OLED display panel comprises:
a plurality of pixel units comprising a red subpixel, a green subpixel, and a blue subpixel;
a substrate;
an array driving layer disposed on the substrate;
a light-emitting device layer disposed on the array driving layer and comprising a first light-emitting device emitting blue light disposed in a region of the blue subpixel, a second light-emitting device emitting red light disposed in a region of the red subpixel, and a third light-emitting device disposed in a region of the green subpixel;
a color conversion layer disposed on the light-emitting device layer, corresponding to the region of the green subpixel, and configured to convert light emitted by the third light-emitting device into green light;
a first black matrix layer, wherein the first black matrix layer is disposed in gap regions between the red subpixel, the green subpixel, and the blue subpixel, and is arranged in a same layer as the color conversion layer;
a transparent leveling layer disposed in gaps of the first black matrix layer corresponding to the region of the blue subpixel and the region of the red subpixel, wherein the transparent leveling layer is formed to have a same height as that of the first black matrix layer for planarization; and
a color resist layer disposed on the first black matrix layer, the transparent leveling layer, and the color conversion layer, wherein the color resist layer comprises a green color resist corresponding to the region of the green subpixel, a blue color resist corresponding to the region of the blue subpixel, and a red color resist corresponding to the region of the red subpixel.

10. The display device according to claim 9, wherein the third light-emitting device comprises a light-emitting diode (LED) device.

11. The display device according to claim 10, wherein the blue OLED device comprises an anode layer, a hole injection layer, a hole transport layer, a blue light-emitting layer, an electron transport layer, an electron injection layer, and a cathode layer sequentially stacked.

12. The display device according to claim 11, wherein the blue light-emitting layer comprises at least two blue light-emitting sublayers, and two adjacent blue light-emitting sublayers comprise different host light-emitting materials.

13. The display device according to claim 11, wherein the blue light-emitting layer comprises at least two kinds of blue host light-emitting materials.

14. The display device according to claim 9, wherein the color conversion layer comprises a green fluorescent material or a green quantum dot material.

* * * * *